United States Patent [19]

Miura et al.

[11] Patent Number: 5,160,962
[45] Date of Patent: Nov. 3, 1992

[54] PROJECTION EXPOSURE APPARATUS

[75] Inventors: Seiya Miura, Isehara; Akiyoshi Suzuki, Tokyo, both of Japan

[73] Assignee: Canon Kabushiki Kaisha, Tokyo, Japan

[21] Appl. No.: 642,408

[22] Filed: Jan. 17, 1991

[30] Foreign Application Priority Data

Jan. 17, 1990 [JP] Japan .................. 2-7889

[51] Int. Cl.⁵ ........................... G03B 27/42
[52] U.S. Cl. ......................... 355/53; 355/54; 355/74; 355/68; 355/71
[58] Field of Search ............. 355/53, 54, 74, 68, 355/69, 71

[56] References Cited

U.S. PATENT DOCUMENTS

| | | | |
|---|---|---|---|
| 4,521,082 | 6/1985 | Suzuki et al. | |
| 4,589,769 | 5/1986 | Matsuki | 355/71 |
| 4,634,240 | 1/1987 | Suzuki et al. | |
| 4,659,228 | 4/1987 | Totsuka et al. | 356/401 |
| 4,675,702 | 6/1987 | Gerber | 355/53 |
| 4,746,958 | 5/1988 | Yamakawa | 355/53 |
| 4,780,747 | 10/1988 | Suzuki et al. | 355/53 |
| 4,871,257 | 10/1989 | Suzuki et al. | 356/400 |
| 4,931,830 | 6/1990 | Suwa et al. | 355/53 |

*Primary Examiner*—Monroe H. Hayes
*Attorney, Agent, or Firm*—Fitzpatrick, Cella, Harper & Scinto

[57] ABSTRACT

A projection exposure apparatus is disclosed which includes an illumination system with a masking mechanism having an aperture of variable shape, a projection optical system, a photoreceptor disposed adjacent to an image plane of the projection optical system, and an adjuster for adjusting the masking mechanism, wherein the adjuster is contributable to reduce the size of the aperture and to shift the position of the aperture, such that, with the cooperation of the projection optical system, a relatively small light pattern is produced on the image plane and the produced light pattern is displaced along the image plane, and wherein the photoreceptor receives light from the produced light pattern.

11 Claims, 3 Drawing Sheets

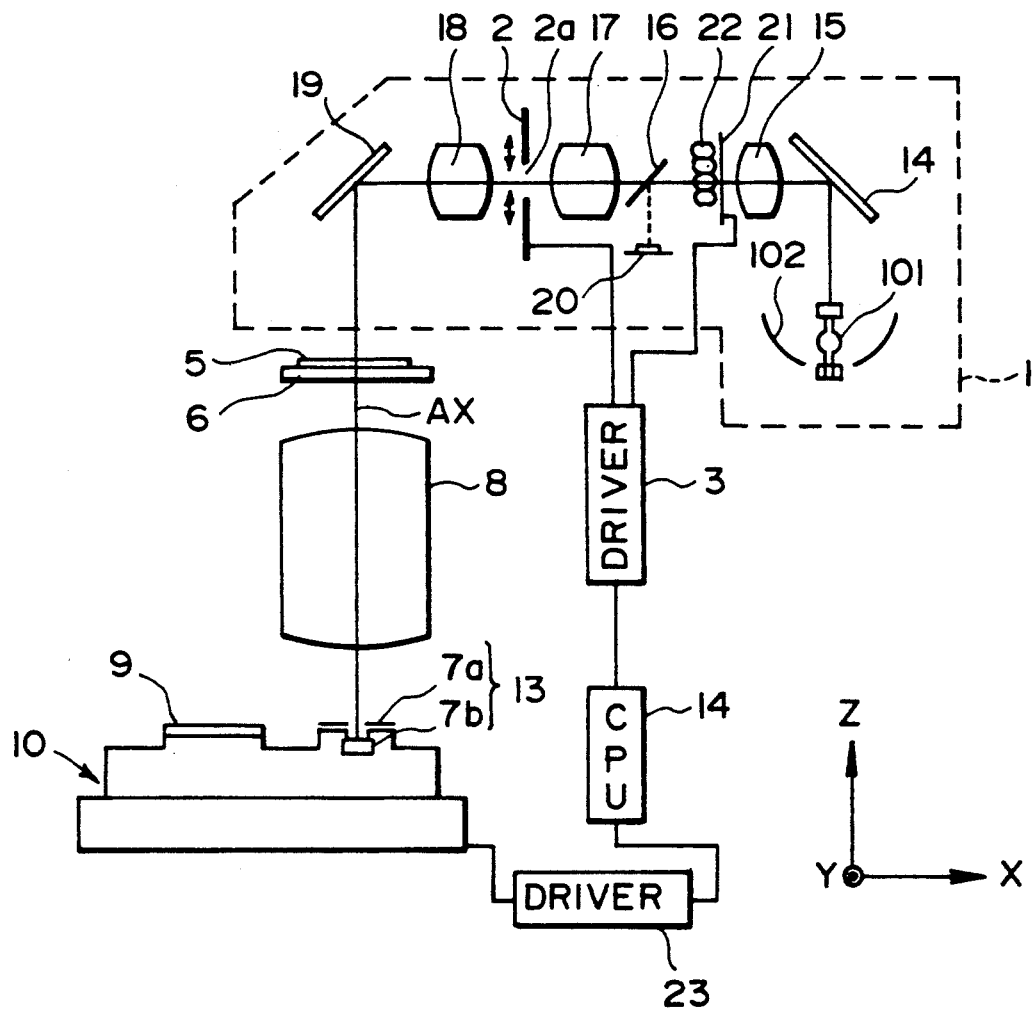
F I G. 1

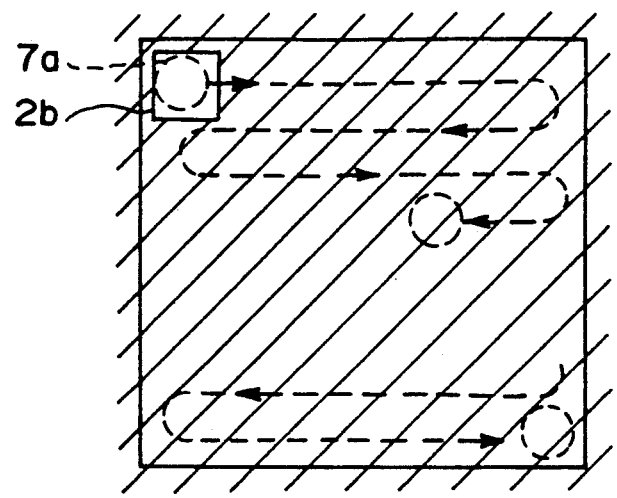
F I G. 2
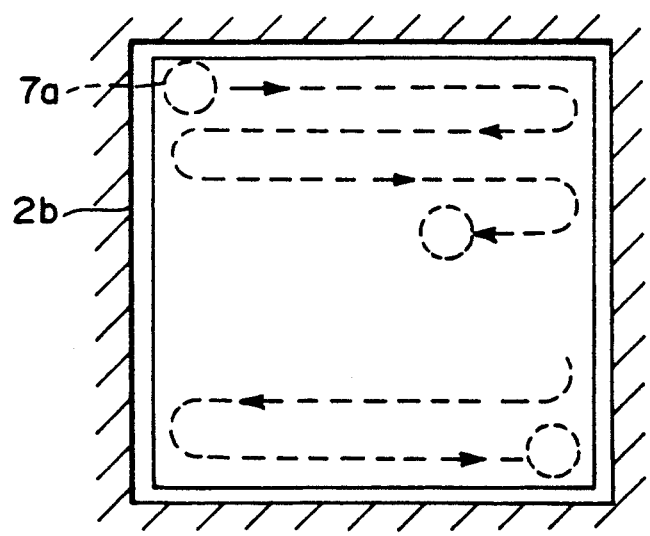
F I G. 3

PROJECTION EXPOSURE APPARATUS

FIELD OF THE INVENTION AND RELATED ART

This invention relates to a projection exposure apparatus and, more particularly, to a reduction projection exposure apparatus, called a "stepper", for use in the manufacture of semiconductor devices, for example.

Conventionally, in this type of apparatus, an illuminomitor is mounted on a wafer stage for measurement of illuminance distribution. An aperture of light blocking means (masking blade means) of an illumination system used is held fully opened, and light intensities at different portions of light supplied by the illumination system and projected by a projection lens system upon an image plane of the projection lens system are measured while moving the illuminomitor along the image plane to thereby determine the illuminance distribution.

FIG. 3 shows this, wherein an illumination zone on an image plane as well as the position of the measuring surface of an illuminomitor, which is changing, are illustrated. The measuring surface of the illuminomitor is defined by a pinhole 7a of a diameter of about 0.5 mm and it is set substantially at the same level as the image plane of a projection lens system (not shown). With two-dimensional movement of a wafer stage, not shown, the illumination zone 2b of rectangular shape, enclosed by a hatched region, is scanned by the measuring surface of the illuminamitor as indicated by a phantom-line arrow. Thus, light intensities at different points in the illumination zone 2b are measured. The inside line within the illumination zone 2b depicts the range of scan by the measuring surface.

Generally, such illuminance distribution measurement is made before starting the normal exposure operation of an exposure apparatus. However, during the measurement, a large quantity of light passes through the projection lens system. As a result, due to the light absorption of the projection lens system itself or the like, a temperature change is produced in the lens system which causes a change in refractive index of the lens system. This leads to some inconveniences such as follows:

First, during the measurement, the position of the image plane of the projection lens system changes. This obstructs correct measurement of the illuminance distribution.

Second, the quantity of change in the position of the image plane of the projection lens system as the illuminance distribution measurement is completed is very large. Therefore, a long time is necessary until the initial state of the image plane position is resumed. This causes a delay in starting the exposure operation and, thus, an undesirable decrease in the throughput of the exposure apparatus.

SUMMARY OF THE INVENTION

It is accordingly a primary object of the present invention to provide a projection exposure apparatus wherein only a small change of an image plane of a projection optical system used is produced.

In accordance with an aspect of the present invention, to achieve this object, there is provided a projection exposure apparatus, which comprises: an illumination system with a masking mechanism having an aperture of variable shape; a projection optical system; a photoreceptor disposed adjacent to an image plane of said projection optical system; and an adjuster for adjusting said masking mechanism; wherein said adjuster is contributable to reduce the size of said aperture and to shift the position of said aperture, such that, with the cooperation of said projection optical system, a relatively small light pattern is produced on said image plane and the produced light pattern is displaced along said image plane, and wherein said photoreceptor receives light from the produced light pattern.

In one preferred form of the present invention, the projection exposure apparatus includes a stage which is movable two-dimensionally along the image plane of the projection optical system, and the photoreceptor is so mounted on this stage that the light receiving surface of the photoreceptor is set substantially at the same level as the image plane.

The masking mechanism may be disposed in the neighborhood of a supporting member which supports a photomask, for example, having a pattern whose image is to be projected on the image plane. Alternatively, the masking mechanism may be disposed at a position which is spaced from such a supporting member and is optically conjugate with the image plane. The masking mechanism may be provided by a well-known type mechanical structure or an electro-optical structure such as a liquid crystal shutter device, for example.

The illumination system may comprise a shutter for selectively allowing/blocking passage of light therethrough (on/off control). The on/off control of the shutter may be made in a timed relation with the displacement of the aperture of the masking mechanism. This may be such synchronization control that the light is blocked during displacement of the aperture while the passage of it is allowed when the aperture is held stationary.

The projection optical system may be an optical system having a lens system or a mirror system. Many types of arrangements are possible.

The stage may be a wafer stage on which a wafer to be exposed by an image of a pattern of a photomask is to be placed.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a schematic and diagrammatic view of a projection exposure apparatus according to an embodiment of the present invention.

FIG. 2 is a schematic representation, showing an illumination zone on an image plane, defined in the apparatus of FIG. 1, as well as the position of a measuring surface of an illuminomitor.

FIG. 3 is a schematic representation, showing an illumination zone of an image plane, defined in a conventional exposure apparatus, as well as the position of a measuring surface of an illuminomitor thereof.

DESCRIPTION OF THE PREFERRED EMBODIMENTS

Figure 4A:
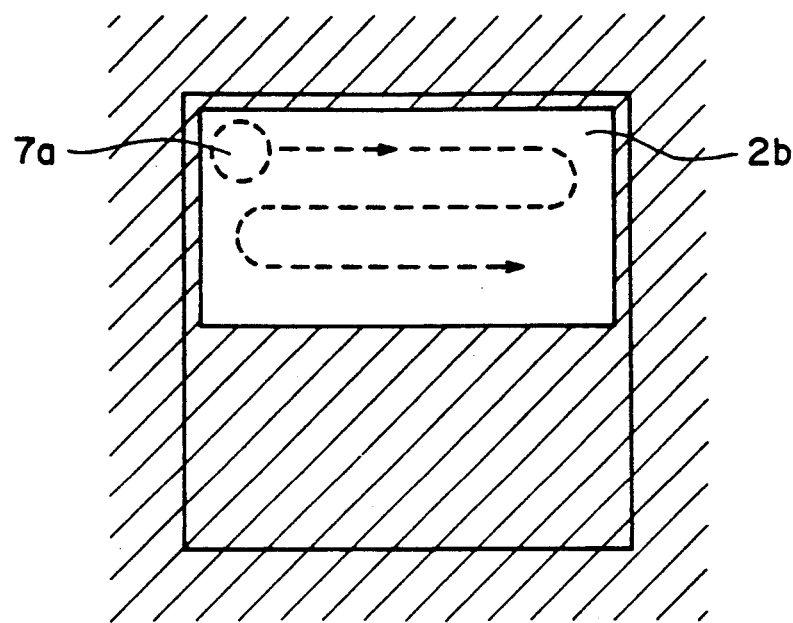
FIGS. 4A and 4B are schematic representations, showing other embodiments of the present invention wherein the irradiation of the illumination zone is controlled in different ways.

Referring to FIG. 1 showing a projection exposure apparatus according to an embodiment of the present invention, denoted generally at 1 is an illumination system having an ultra high voltage Hg lamp. Light from the lamp 1 is reflected by an elliptical mirror 102 and then is directed by a collecting lens system 15 to an optical integrator 22. Shutter 21 for on/off control of light is disposed between the lens 15 and the integrator 22. An image of the lamp 101 is formed at the second focal point position of the elliptical mirror 102, and the lens 15 serves to re-image the lamp 101 image upon the integrator 22.

The integrator 22 serves to divide the received light to form a plurality of secondary light sources. Light rays from these secondary light sources are directed by a collecting lens 17 to a masking mechanism 2 having an aperture 2a, and they are superposed one upon another on the plane in which the aperture 2a of the masking mechanism 2 is defined. Thus, through the cooperation of the integrator 22 with the lens 17, the aperture 2a of the masking mechanism 2 is illuminated with uniform illuminance.

The masking mechanism has a plurality of light blocking plates (masking blades), such as disclosed in U.S. Pat. No. 4,589,769 assigned to the same assignee of the subject application. More particularly, four movable masking blades are used and the aperture 2a is defined by opposed edges of these masking blades. By moving these masking blades such as indicated by arrows in FIG. 1, the size (shape) and the position of the aperture 2a can be changed as desired to change the size and the position of the illumination zone which is defined on a reticle or an image plane of a projection lens system 8 to be described later. In this example, the plane in which the aperture 2a is defined is set parallel to the plane which is orthogonal to the optical axis of the illumination system, and the masking blades can be moved along that plane by a driving means 3.

The masking mechanism 2 serves to pass a certain portion of the light from the lens 17, to a relay optical system 18 having arrayed lenses. The light from the relay optical system 18 is reflected by a deflecting mirror 19 and the reflected light impinges on a reticle 5 having a circuit pattern. Here, the relay optical system 18 and the mirror 19 are so set as to provide an optically conjugate relationship between the plane in which the aperture 2a of the masking mechanism 2 is defined and the plane in which the circuit pattern of the reticle 5 is held. Thus, at the time of projection of the image of the circuit pattern, an image of the aperture 2a (edges thereof) can be projected on the reticle 5. It is added here that the reticle 5 comprises a silica ($SiO_2$) substrate on which an enlarged-size circuit pattern is formed by chromium (Cr).

The reticle 5 is placed on a reticle stage 6. Projection lens system 8 serves to project an image of the circuit pattern of the reticle 5 upon a wafer 9 in a reduced scale (e.g. 1/5), in cooperation with the illumination system 1. The wafer 9 is placed on an X-Y stage 10 which can be moved two-dimensionally along an image plane (X-Y plane) of the projection lens system 8, by a driving means 23. The driving means 23 also serves to move a wafer chuck, mounted on the X-Y stage 10, along an optical axis AX (in the Z direction) of the projection lens system.

Denoted generally at 13 is a light detecting means which is fixedly mounted on the X-Y stage 10. The light detecting means 13 is provided by a light receiving device which comprises a pinhole 7a (of a diameter of about 0.5 mm in this embodiment) and a photoreceptor 7b for receiving light passing through the pinhole 7a. The pinhole 7a is formed at the center of a light blocking plate, and the upper surface (measuring surface) of this plate is held substantially at the same level as the image plane of the projection lens system. In this example, the upper surface of the light blocking plate is set substantially at the same level as the surface of the wafer 9 (surface to be exposed).

In this embodiment, the driving means 3 is used to selectively narrow the aperture 2a of the masking member 2, as compared with the size of that aperture as the same is fully opened, and an image of the aperture 2a is projected on the image plane of the projection lens system 8 by means of the optical system 18 and the mirror 19 as well as the projection lens system 8 itself. Here, as best seen in FIG. 2, the components are so set that the pinhole 7a is included by the image 2b of the aperture 2a.

Control means 14 having a central processing unit supplies an instruction signal to each of the driving means 3 and 23 so as to control the movement of the stage 10 as well as the operation of the masking mechanism and the shutter mechanism. Denoted at 20 is a photodetector provided for the exposure quantity control. It receives a portion of light from the integrator, passing through a half mirror 16 (which may be a full mirror), to monitor the light quantity from the Hg lamp 101. It is to be noted that, of the light from the lamp 101, light components of i-line or g-line are extracted by using an unshown filter and are used further.

In this embodiment, the amount of movement of the X-Y stage 10 with respect to the X direction and to the Y direction is measured by using a pair of laser interferometers (not shown) and, on the basis of this measurement, the position of the wafer 9 or the position of the pinhole 7a (measuring surface) of the light detecting means 13 can be determined. The positional information about the X-Y stage 10 obtained from the laser interferometers is supplied to the control means 14, for the control of the driving means 3 and 23.

For exposure operation, the wafer 9 is introduced into the projection exposure apparatus from a wafer cassette (not shown) by using a wafer supply hand (not shown) and is placed on the wafer chuck of the X-Y stage 10. The wafer held by the wafer chuck is then aligned with respect to the reticle 5, this being made by moving the X-Y stage 10 under the influence of the control means 14 and the driving means 23. Then, light is supplied from the illumination system 1 to illuminate the circuit pattern of the reticle 5, such that an image of the circuit pattern is projected onto the wafer by the projection lens system 8. By this, the wafer 9 is exposed to the image of the circuit pattern of the reticle 5. Here, by the adjustment of the masking blades of the masking mechanism 2 through the driving means 3, the size and position of the aperture 2a of the masking mechanism as defined by these masking blades are so determined that only the circuit pattern area of the reticle 5 is illuminated with the light passing from the aperture 2a. Thus, any portion of the wafer 9 other than the region to be exposed at that time is prevented from being illuminated with the light supplied from the illumination system 1.

In this projection exposure apparatus, the process from the reticle-to-wafer alignment to the exposure of the wafer to the reticle circuit pattern is repeated for different zones (shot areas) of the wafer in the step-and-repeat manner, by which the circuit pattern of the reticle is printed on each of these zones of the wafer. After completion of the step-and-repeat exposure of the wafer, it is off-loaded from the X-Y stage 10 by means of a wafer collecting hand (not shown) and the wafer is conveyed out of the exposure apparatus.

For measurement of the illuminance and/or the illuminance distribution on the image plane of the projection lens system 8, if a reticle is placed on the reticle stage 6, the reticle is off-loaded from the reticle stage by means of a reticle hand (not shown). On a condition that no reticle is at the reticle stage, the X-Y stage 10 is moved by the driving means 23 so as to place the pinhole 7a of the light detecting means 13 at the image plane of the projection lens system 8.

Then, the driving means 3 is actuated to narrow the aperture 2a of the masking mechanism 2 so as to reduce, as best seen in FIG. 2, the size of the light pattern provided by the image 2b of the aperture 2a as formed on the image plane, as compared with that defined for the projection of the circuit pattern, but to assure that the pinhole 7a of the light detecting means is included in the light pattern. Concurrently, the X-Y stage 10 is moved by the driving means 23 to locate the pinhole 7a at its predetermined initial position, in a predetermined range of measurement, on the image plane of the projection lens system 8. Then, the shutter mechanism is opened and the image 2b of the aperture 2a is projected on the pinhole 7a. Subsequently, under the influence of the driving means 3 and 23 controlled by the control means 14, the masking blades of the masking mechanism 2 are adjusted, continuously or intermittently, to shift the aperture 2a continuously or intermittently so as to scan the image plane with its image 2b, as seen in FIG. 2. Concurrently, the X-Y stage 10 is so moved that the pinhole 7a follows the scanning movement of the image 2b. Thus, during the scan, the light image 2b continuously irradiates the pinhole 7a. In this manner, the illuminances at different points on the image plane can be measured sequentially and, on the basis of this, the illuminance distribution can be determined.

As described, substantially only such a portion of the light from the illumination system 1 that is necessary for measurement of the illuminance at each point on the image plane is passed through the aperture 2a and is inputted to the projection lens system 8. This reduces the quaitity of light inputted to the projection lens system and, therefore, reduces the quantity of light absorption of the lens elements constituting the projection lens system, during the measurement.

As an example, if the aperture 2a when it is fully opened defines on the reticle 5 surface an illumination zone of a square shape of having a size of 75 mm (each side), for measurement the aperture 2a may be narrowed so as to define, as an example, an illumination zone of 2.5 mm square on the plane to be occupied by the reticle 5 surface (thus defining on the image plane an image (2b) of square shape having a side length substantially equal to the diameter of the pinhole 7a). In that case, the quantity of light inputted to the projection lens system is reduced to about 1/900 (=(2.5×2.5)/(75×75)). Thus, the quantity of light absorption of the projection lens system and the resultant temperature rise in the projection lens system can be reduced remarkably as compared with that by the conventional measurement process.

Thus, with the present invention, it is possible to reduce or omit the time for cooling the projection optical system, after completion of the measurement and before the start of an exposure operation (conventionally, it is several tens of minutes to about one hour). As a result, it is possible to increase the throughput of the exposure apparatus. Further, with the present invention, any shift of the image plane of the projection lens system due to temperature rise thereof is reduced remarkably. Therefore, it is possible to measure the illuminance distribution on the image plane very accurately.

Figure 4B:
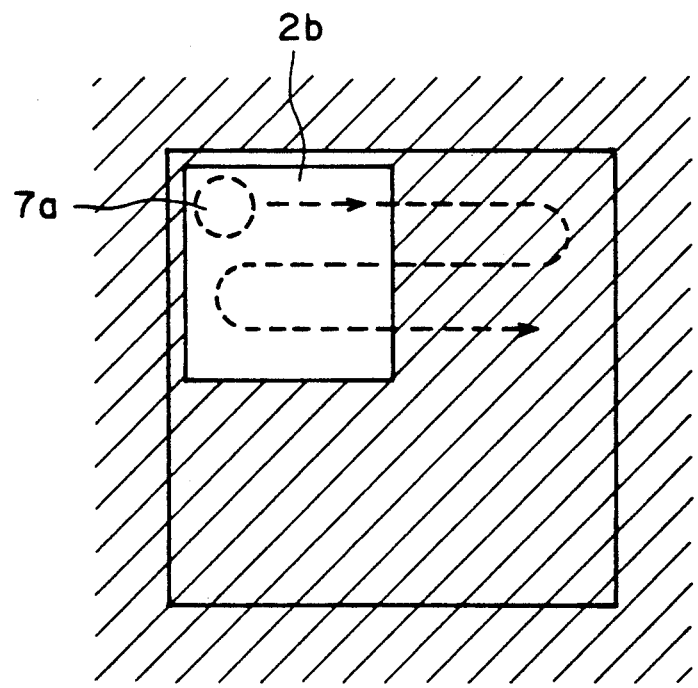

As shown in FIGS. 4A and 4B, the size of the illumination zone on the image plane may be reduced to about a half ($\frac{1}{2}$) or a quarter ($\frac{1}{4}$) of that to be defined when the aperture 2a is fully opened. This reduces the quantity of light received by the projection lens system to about a half or a quarter and, therefore, the temperature rise in the projection lens system is reduced. When the illumination zone 2b of such size is to be defined, the aperture 2a of the masking mechanism may be held fully open (without specific adjustment) and, in place thereof, an additional light blocking member or members may be used to intercept an unnecessary portion of light directed to the projection lens system 8.

In the present invention, for enhanced advantageous effects, the mechanisms 2 and 21 as well as the X-Y stage 10 may be controlled through the driving means 3 and 23 and the control means 14 to assure that the shutter 21 is closed during shift of the pinhole 7a and the aperture 2a and that the shutter 21 is opened after they are positioned and held stationary at a particular position. This ensures that the light from the illumination system 1 impinges on the projection lens system only when the illuminance at the particular position is going to be detected.

In the preceding embodiments, for measurement of the illuminance distribution on the image plane, while monitoring the position coordinate of the pinhole 7a through the control means 14, signals from the light receiving device 7b may be detected to measure the illuminances at different locations sequentially. The obtained data may be memorized into a memory of the control means 14, for example, and by this, the illuminance distribution can be determined.

For measurement of the illuminance distribution, usually no reticle is placed on the reticle stage, as described. If in this state the aperture 2a of the masking mechanism is opened widely for measurement of the illuminance distribution, a large quantity of light enters into the projection lens system. As a result, a large quantity of light is absorbed by the projection lens system and thus the image plane thereof or the optical characteristic thereof such as magnification changes to a great degree. If after the measurement a reticle having a small percentage of light transmitting areas (e.g. contact holes) is set, then the projection lens system is forced to be changed promptly from the largest light absorption state to the small light absorption state. Such a transitional characteristic change will have a large adverse effect on the projection lens system. Depending on the time consumed for the measurement of the illuminance distribution or due to a change in power of a Hg lamp or the like, in such a conventional method, the characteristic of the projection lens system just after completion of the measurement is unstable in many respects.

As compared therewith, according to the present invention, only or substantially only such an area with respect to which the illuminance is going to be measured is irradiated with the light. With this method, the measurement of illuminance distribution does not cause absorption of a large quantity of light by the projection lens system. Thus, the characteristic change is small and it is possible to start the normal exposure operation from a stable ground state.

In the present invention, the masking mechanism 2 or an additional masking mechanism of a similar structure may be disposed close to the reticle 5 position. Further, the masking mechanism 2 may be replaced by an electrooptic mechanism comprising an array of light modulation elements, such as a liquid crystal shutter device. Moreover, the projection lens system 8 may be a projection mirror system having convex and concave mirrors, for example.

The light detecting means is not limited to the disclosed form wherein light is received through a light blocking plate having a pinhole. It may have a light receiving surface of a size larger than the light pattern projected on the image plane. Thus, the structure of the light detecting means may be modified in many ways, as desired. Further, it is not always necessary that the light receiving surface of the light detecting means is kept in the image plane of the projection optical system. For example, if the masking mechanism projects a very small light pattern upon the image plane, then the illuminance distribution can be measured sufficiently accurately.

Moreover, the present invention is applicable to an exposure apparatus having a laser such as an excimer laser as its light source means.

While the invention has been described with reference to the structures disclosed herein, it is not confined to the details set forth and this application is intended to cover such modifications or changes as may come within the purposes of the improvements or the scope of the following claims.

What is claimed is:

1. A projection exposure apparatus, comprising:
   an illumination system for emitting light, said illumination system comprising a masking mechanism having an aperture of variable shape;
   a projection optical system for receiving the light emitted from said illumination system;
   a photoreceptor disposed adjacent to an image plane of said projection optical system for receiving light from a produced light pattern; and
   an adjuster for adjusting said masking mechanism by reducing the size of said aperture and shifting the position of said aperture to produce, by utilizing said projection optical system, a relatively small light pattern on the image plane and to displace the produced light pattern along the image plane, such that said photoreceptor receives light from the produced light pattern.

2. An apparatus according to claim 1, wherein said photoreceptor comprises a light receiving surface disposed substantially within the image plane.

3. An apparatus according to claim 1, further comprising means for moving said photoreceptor along the image plane, together with the displacement of the light pattern.

4. An apparatus according to claim 1, further comprising a stage which is movable two-dimensionally and upon which said photoreceptor is mounted.

5. An apparatus according to claim 4, wherein said stage comprises a wafer stage on which a wafer for manufacturing semiconductor devices is placed, and wherein an image of a circuit pattern is projected on the wafer by said illumination system and said projection optical system.

6. An apparatus according to claim 1, wherein said illumination system comprises a shutter mechanism for selectively producing the light pattern, said shutter mechanism operating in a timed relation with the shift of said aperture by said adjuster to produce the light pattern when said aperture is held stationary and to produce no light pattern when said aperture is being shifted.

7. An apparatus according to claim 1, wherein said masking mechanism comprises a liquid crystal shutter means.

8. An apparatus according to claim 1, wherein said masking mechanism comprises a plurality of movable blades having edges for defining said aperture.

9. An apparatus according to claim 1, wherein said projection optical system comprises a lens system.

10. An apparatus according to claim 1, wherein said projection optical system comprises a mirror system.

11. An apparatus according to claim 1, wherein said aperture of said masking mechanism is disposed at a position substantially optically conjugate with the image plane and wherein the light pattern is formed by an image of said aperture.

* * * * *

UNITED STATES PATENT AND TRADEMARK OFFICE
CERTIFICATE OF CORRECTION

PATENT NO. : 5,160,962
DATED : November 3, 1992
INVENTOR(S) : Seiya Miura, et al.

It is certified that error appears in the above-identified patent and that said Letters Patent is hereby corrected as shown below:

COLUMN 1

Line 11, "luminomitor" should read --luminometer--;
Line 18, "illuminomitor" should read --illuminometer--;
Line 23, "illuminomitor," should read --illuminometer,--;
Line 24, "illuminomitor" should read --illuminometer--; and
Line 31, "illuminamitor." should read --illuminometer.--.

COLUMN 2

Line 59, "illuminomitor." should read --illuminometer.--; and
Line 64, "illuminomitor" should read --illuminometer--.

COLUMN 3

Line 43, "lens 17," should read --lens 17--

Signed and Sealed this

Sixteenth Day of November, 1993

Attest:

BRUCE LEHMAN

Attesting Officer
Commissioner of Patents and Trademarks